United States Patent [19]

Rosenthal

[11] Patent Number: 4,978,628
[45] Date of Patent: Dec. 18, 1990

[54] DRAIL-WELL/EXTENSION HIGH VOLTAGE MOS TRANSISTOR STRUCTURE AND METHOD OF FABRICATION

[75] Inventor: Bruce D. Rosenthal, Sunnyvale, Calif.

[73] Assignee: Teledyne Industries, Inc., Mountain View, Calif.

[21] Appl. No.: 177,932

[22] Filed: Jun. 16, 1988

Related U.S. Application Data

[62] Division of Ser. No. 932,707, Nov. 19, 1986, abandoned.

[51] Int. Cl.$^5$ .......................................... H01L 21/265
[52] U.S. Cl. ...................................... 437/44; 437/34; 437/41; 437/57; 357/23.3; 357/44
[58] Field of Search .................. 437/41, 34, 44, 57, 437/225; 357/23.6, 23.9, 23.11, 23.8, 41, 23.3, 44; 156/643

[56] References Cited

U.S. PATENT DOCUMENTS

| | | | |
|---|---|---|---|
| 4,267,558 | 5/1981 | Guterman | 357/41 |
| 4,288,801 | 9/1981 | Ronen | 357/23.4 |
| 4,302,766 | 11/1981 | Guterman et al. | 357/41 |
| 4,342,149 | 8/1982 | Jacobs et al. | 437/30 |
| 4,433,468 | 2/1984 | Kawamata | 437/34 |
| 4,546,370 | 10/1985 | Curran | 357/23.4 |
| 4,562,638 | 1/1986 | Schwabe et al. | 437/44 |
| 4,577,391 | 3/1986 | Hsia | 437/36 |
| 4,599,576 | 7/1986 | Yoshida et al. | 357/23.8 |
| 4,609,929 | 9/1986 | Jayaraman et al. | 357/23.8 |
| 4,613,885 | 9/1986 | Haken | 437/34 |
| 4,637,124 | 1/1987 | Okuyama et al. | 437/151 |
| 4,647,957 | 3/1987 | Coquin et al. | 357/23.8 |
| 4,656,492 | 4/1987 | Sunami et al. | 357/23.3 |
| 4,717,684 | 1/1988 | Katto et al. | 437/44 |
| 4,769,686 | 9/1988 | Horiuchi et al. | 357/23.3 |
| 4,801,555 | 1/1989 | Holly et al. | 437/44 |

FOREIGN PATENT DOCUMENTS

| | | | |
|---|---|---|---|
| 0052272 | 4/1980 | Japan | 357/23.8 |
| 0045076 | 4/1981 | Japan | |
| 0280667 | 12/1986 | Japan | |

OTHER PUBLICATIONS

Bampi et al., "A Modified Lightly Doped Drain Structure for VLSI MOSFET's ", *IEEE Trans. on Electron Devices*, vol. ED-33, No. 11, Nov. 1986, pp. 1769-1779.

Jankovic, "Role of Source N+N− Structure in Parasitic Bipolar Action of Lightly Doped Short-Channel MOSFETs", *Electronic Letters*, Apr. 23, 1987, vol. 23, No. 9, pp. 461-463.

*Primary Examiner*—Olik Chaudhuri
*Assistant Examiner*—M. Wilczewski
*Attorney, Agent, or Firm*—Fliesler, Dubb, Meyer & Lovejoy

[57] ABSTRACT

A high-voltage MOS transistor structure and the manner of its fabrication are disclosed. The transistor structure is fabricated at the surface of a semiconductor layer or substrate where the structure includes first and second regions provided at the surface spaced apart from one another by an intervening portion of the semiconductor layer. The first and second regions are of a predetermined conductivity type. A third region is provided in the semiconductor layer adjacent the first region. The third region extends from the first region partially across the intervening portion of the semiconductor layer at the substrate surface toward to second region and then extends into the semiconductor layer under the first region. A channel is thus defined between the third region and the second region. The channel interface junction of third region defines an arc curving under the first region. The third region is also of the predetermined conductivity.

7 Claims, 5 Drawing Sheets

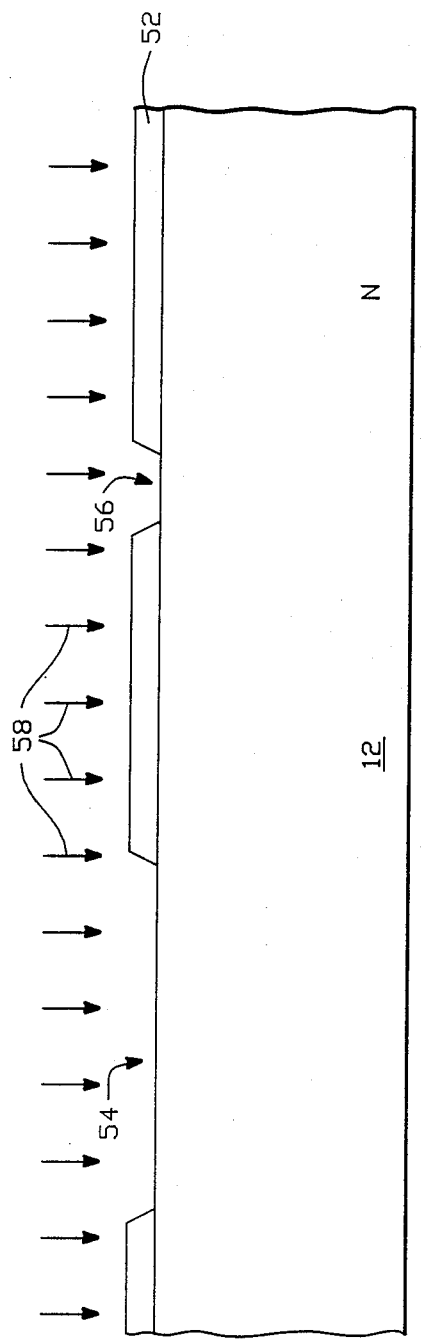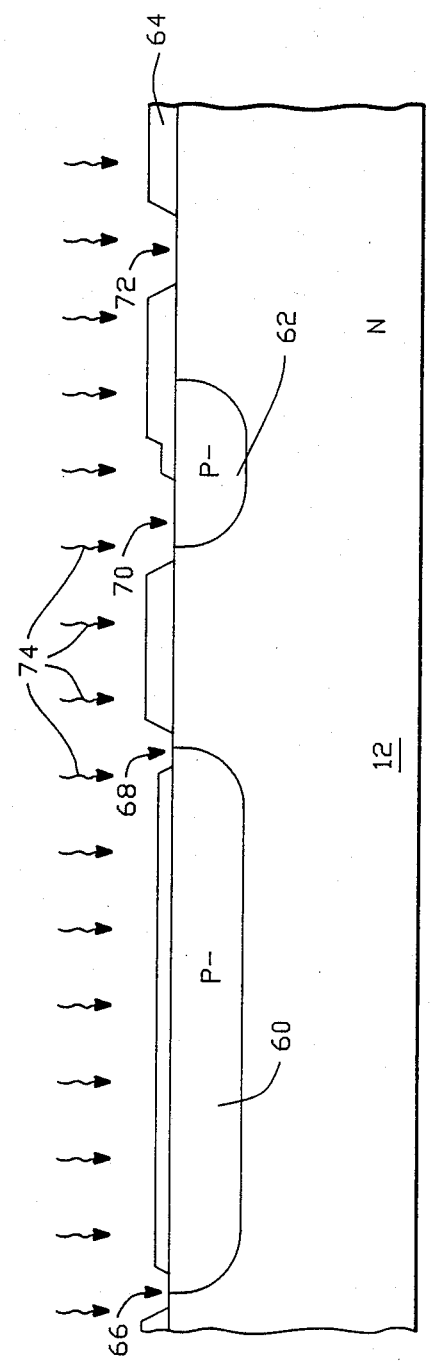

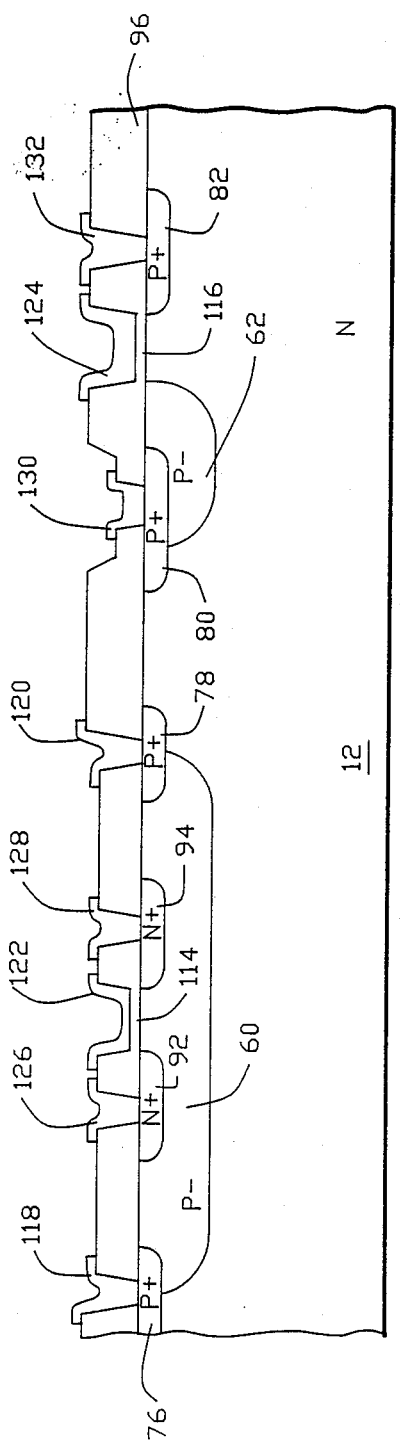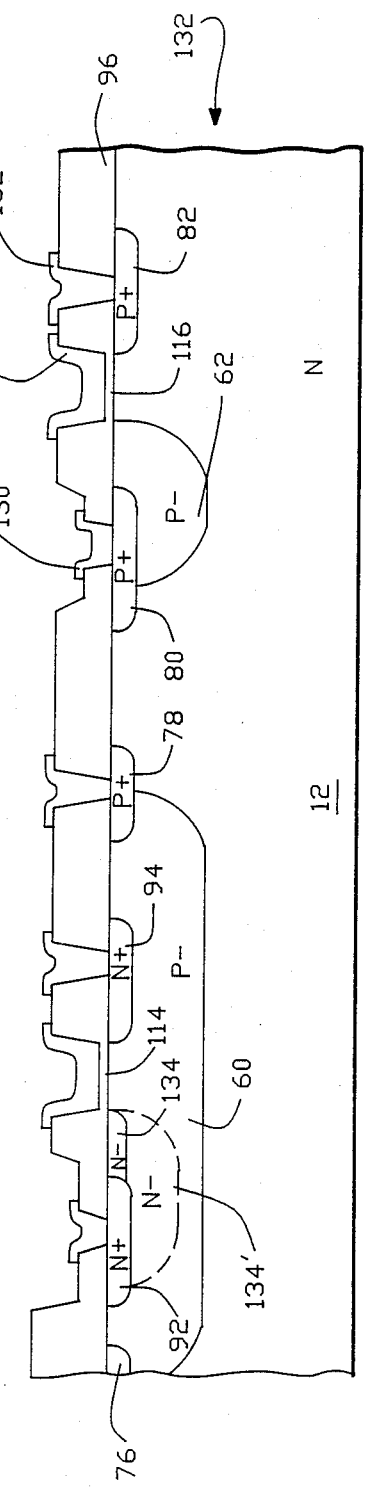

4,978,628

DRAIL-WELL/EXTENSION HIGH VOLTAGE MOS TRANSISTOR STRUCTURE AND METHOD OF FABRICATION

This is a division of Ser. No. 06/932,707 filed Nov. 19, 1986 now abandoned.

FIELD OF THE INVENTION

The present invention generally relates to high-voltage metal oxide semiconductor (MOS) transistor designs and, in particular, to a MOS transistor structure utilizing a drain-well/extension region to realize high-voltage operation. The present invention further relates to a process of fabricating a drain-well/extension MOS transistors simultaneously with speed optimized MOS transistors, including complimentary MOS transistors.

BACKGROUND OF THE INVENTION

There is a continuing desire to produce integrated MOS transistor logic circuits to implement functions that are increasingly sophisticated, complex and diverse. Consequently, there has been and continues to exist substantial development efforts aimed at improving the speed, packing density and functional capabilities of MOS logic devices. As a result, many different designs for high-speed, close packed MOS logic transistors have been developed. Characteristically, such logic transistors operate at voltage levels of five volts or less. Integrated circuits utilizing hundreds to hundreds of thousands of such transistors can now be fabricated on a single substrate die and, depending on the particular circuit design, can perform a great variety of logic functions.

Naturally, every integrated circuit must possess a suitable interface to interconnect with external devices. Where the interface must only support connections to other logic circuits, the required circuit interface function is typically implemented using logic voltage level drive subcircuits to propagate signals across the interface.

Interfacing logic circuits to devices that do not conveniently operate at logic voltage levels presents a special problem. Separate, specialized integrated circuits are conventionally employed to buffer the logic integrated circuits from external devices that, for example, require high-voltage levels to control the display of information, such as CRTs, plasma and fluorescent displays, or to control electromechanical devices, such as servos, relays and motors. These buffer integrated circuits generally implement a dual interface to provide voltage translation between logic interface levels and the levels required by the high-voltage external device. The required use of such buffer integrated circuits, as a practical matter, imposes a penalty of increased physical complexity, cost, size and power requirements in the resulting system. Integration of the high-voltage buffer function onto a primarily logic function integrated circuit is therefore desirable to minimize this penalty. Alternately, integration of a substantial logic function onto the buffer integrated circuit is desirable to increase the flexibility and functionally of the buffer circuit toward or to the level of a dedicated peripheral controller. Consequently, there is a need to provide high operational voltage MOS transistors on the same substrate as high-speed, comparatively low voltage MOS logic transistors.

A major impediment to providing high-voltage MOS transistors on a common substrate with high-speed MOS logic transistors is the complexity of the required fabrication process. The process must provide for the simultaneous fabrication of transistors optimized for high-voltage and others closely spaced, if not adjacent, for high-speed. Although both high and high-voltage transistors may require optimization with respect to the same physical phenomena, the specifics of the process optimization are typically quite different. For example, high-voltage transistor optimization requires maximizing the punch-through limit and reverse breakdown voltages of the transistor typically in preference over switching speed. The punch-through voltage limit is the drain to source voltage potential where the source and drain depletion regions first overlap. An overlap would establish an unconstrained conduction path between drain and source with a corresponding likely catastrophic failure of the device. Similarly, the reverse breakdown voltage limit is the reverse voltage potential at the drain/substrate junction that induces avalanche breakdown. Again, the result will be likely catastrophic failure of the device.

The primary emphasis for high-speed optimization is, in contrast, to shorten the transistor channel length, reduce the effective channel resistance and mitigate specific short channel effects such as gate threshold drift. High-speed transistors need be tailored only for punch-through and reverse breakdown voltages slightly in excess of the maximum logic voltage supply level. Channel resistance is minimized by maintaining the lowest possible channel doping level. Short channel gate voltage threshold drift is the result of the gate oxide of a short channel transistor being charged by hot electrons injected through the semiconductor/oxide interface barrier. Hot electrons are produced by the high electric field strength induced acceleration of electrons at the drain/channel junction. The high field strength is itself a product of the high-voltage gradient between the closely spaced source and drain regions (i.e. short channel).

SUMMARY OF THE INVENTION

Therefore, a purpose of the present invention is to provide a high-voltage optimized MOS transistor structure that can be efficiently fabricated in a common process and on a common substrate with high-speed optimized MOS transistors.

This is achieved in the present invention by providing a transistor structure fabricated at the surface of a semiconductor layer or substrate where the structure includes first and second regions provided at the surface spaced apart from one another by an intervening portion of the semiconductor layer. The first and second regions are of a predetermined conductivity type. A third region is provided in the semiconductor layer adjacent the first region. The third region extends from the first region partially across the intervening portion of the semiconductor layer at the substrate surface toward to second region and then extends into the semiconductor layer under the first region. A channel is thus defined between the third region and the second region. The channel interface junction of third region defines an arc curving under the first region. The third region is also of the predetermined conductivity.

The present invention further provides for a method of fabricating the transistor structure. The method comprises the steps of forming the third region at the semiconductor layer surface. The third region extends as a well into the semiconductor layer. The second and third regions are then formed as shallower regions at the substrate surface. The first region is formed at least partially within the third region while the second region is formed separated from the third region by the channel portion of the semiconductor layer. The first, region, at its closest approach to the channel region, is separated therefrom by an intervening portion of the third region. This intervening portion of the third region acts as an conductive extension of the first region.

Thus, an advantage of the present invention is that is provides a high-voltage MOS transistor structure that exhibits junction breakdown and punch-through voltage limit in excess of 80 volts and, therefore, is readily suited for use in an extensive variety of high-voltage applications.

Another advantage of the present invention is that the high-voltage MOS transistor structure is readily fabricated on a common substrate with high-speed optimized MOS transistor devices without the introduction of complex or critical process steps in order to realize the simultaneous fabrication of high-voltage devices adjacent high-speed devices. The complexity of the fabrication process is not significantly increased over that required for the fabrication of either the high-speed or the high-voltage optimized devices alone.

A further advantage of the present invention is that the high-voltage MOS transistor structure can be fabricated as either a P-channel or an N-channel device. High-speed optimized MOS transistors fabricated in combination with the high-voltage MOS transistor structure of the present invention maybe of the same or complimentary conductivity type, or both, where complimentary (CMOS) logic cells are utilized.

Still another advantage of the present invention is that the high-voltage MOS transistor structure is characterized by a highly linear current/voltage curve that is well suited for use in current source, current mirror and other analog circuits. The MOS transistors fabricated in combination with the high-voltage MOS transistor structures of the present invention maybe utilized to implement either logic or analog functions, or both, thereby permitting the fabrication of integrated circuits implementing both logic and analog subfunctions. Additionally, an embodiment of the present provides a bilateral high-voltage switching function, suitable for use as a high-voltage bilateral analog data switch.

BRIEF DESCRIPTION OF THE DRAWINGS

These and other attendant advantages and further features of the present invention will become apparent and readily appreciated as the same becomes better understood by reference to the following detailed description of the invention when considered in conjunction with the accompanying drawings, wherein like reference numerals designate like parts throughout the figures thereof, and wherein:

FIGS. 5–9 are cross-sectional views illustrating a preferred process of fabricating a drain-well/extension high-voltage MOS transistor structure in combination with a complimentary conductivity, high-speed MOS transistor; and FIG. 10 is a cross-sectional view of a complementary pair of high-voltage MOS transistors constructed in accordance with the present invention.

DETAILED DESCRIPTION OF THE INVENTION

Figure 1:
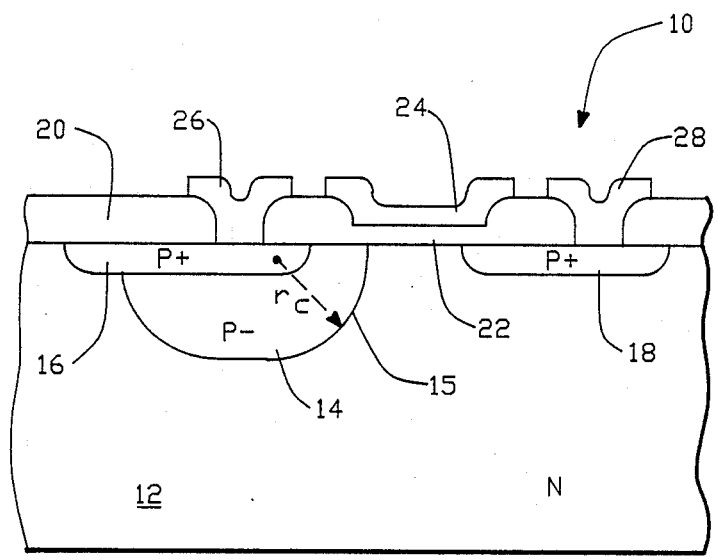
FIG. 1 is a cross-sectional view of a drain-well/extension high-voltage MOS transistor structure constructed in accordance with a preferred embodiment of the present invention.

A preferred embodiment of the drain-well/extension high-voltage MOS transistor structure, constructed in accordance with the present invention and generally indicated by the reference numeral 10, is shown in FIG. 1. The structure 10 is fabricated at the surface of a silicon substrate 12 lightly doped to an N-type conductivity with phosphorous at a background impurity concentration of approximately $10^{15}/cm^3$. A well/extension region 14, having a P- conductivity by the presence of a boron impurity at a concentration of approximately $2 \times 10^{16}/cm^3$ is provided at the surface of the substrate 12. The region 14 extends to a depth of between approximately 6 and 8 micrometers beneath the surface of the substrate 12. The channel junction 15 of the well/extension region 14 is provided with a radius of curvature, $r_c$, that approaches or is approximately equal to the depth of the well/extension region 14.

Drain and source regions 16, 18, are also provided at the surface of the substrate 12. These regions 16, 18 are provided with a P+ conductivity by the presence of boron impurities to a concentration of $10^{19}/cm^3$ and extend to a junction depth of approximately 2 to 3 micrometers beneath the surface of the substrate. The drain region 16 is largely formed within the drain/extension region 14 or at least such that the well/extension region 14 is allowed to exclusively to define the drain junction to the channel region of the structure 10. A "back-side" portion of the drain region 16 maybe exposed generally as shown in FIG. 1. Alternately, the entire drain region 16 maybe encapsulated within the well/extension region 14. The separation of the drain region 16 to the channel junction 15, at their closest approach, may range between 1 and 6 micrometers, though a range between 4 to 5 micrometers is preferred. The source region 18 is provided separate from the well/extension region 14 by a channel length of approximately 15 micrometers though channel lengths may vary between 2 and 30 micrometers with the longer channel lengths being preferred for higher voltage devices and shorter channel lengths being preferred for higher high-voltage switching speed.

A dielectric layer 20 of silicon dioxide, often referred to as a field oxide layer, is provided over the surface of the substrate 12 to a nominal thickness of between approximately 7,000 to 8,000 angstroms. The oxide layer 20 is effectively thinned over the channel region of The structure 10 to form a gate oxide layer 22 ranging between approximately 500 to 600 angstroms in thickness. In accordance with the present invention, the gate oxide 22 extends across the channel region of the structure 10 so that it slightly reaches over the channel junction 15 of the well/extension region 14 and a corresponding junction edge of the source region 18. Drain and source contacts 26, 28 are provided through the oxide layer 20 to contact the drain and source regions 16, 18, respectively. A gate contact 24 is provided over the gate oxide layer 22 to complete the high-voltage MOS transistor structure 10.

The ability of the MOS transistor structure 10 to operate at high-voltages is obtained largely through the provision of the drain-well/extension region 14. The low doping of the well/extension region 14, with respect to that of the drain region 16 acts to substantially reduce the depletion region width associated with the drain 16 as it extends into the substrate 12 at high applied drain to source voltages. That is, the depletion region widths associated with the drain and source regions 16, 18 in general increase as a function of increases in the drain to source voltage potential. Punch-through occurs when the drain and source depletion regions overlap independent of any applied voltage to the gate 24. In accordance with the present invention, the provision of the well/extension region 14 substantially increases the punch-through voltage limit of the structure 10 by significantly reducing the drain depletion region width for any given drain to source voltage.

The drain-well/extension region 14 further operates to substantially increase the junction breakdown limit of the structure 10. The reverse breakdown voltage limit of the drain/channel junction 15 is largely a function of the junction electric field intensity. Provision of the well/extension region 14 mitigates the electric field intensity by providing the junction 15 with a large radius of curvature, $r_c$, with respect to that of the drain region 16. Further, the lowered doping density of the drain-well/extension region 14, again relative to that of the drain region 16, acts to increase the effective junction resistance and, thereby, lower the electric field intensity at the junction 15 for a given drain to source voltage potential.

Finally, the drain-well/extension region 14 enhances the expected long-term high-voltage operational life of the structured by reducing, if not precluding, the injection of charge carriers into the gate oxide 22. Hot electrons may be created in long channel MOS transistors when operated at high drain to source voltage potentials. In accordance with the present invention, the drain-well/extension region 14 increases the effective channel resistance of the structure 10 sufficiently to generally preclude the creation of hot electrons at the substrate surface that, in turn, might otherwise be injected into the gate oxide 22. Consequently, the switching characteristics of the drain-well/extension high-voltage MOS transistor structure 10 is likely to remain essentially constant throughout its operational lifetime.

Figure 2:
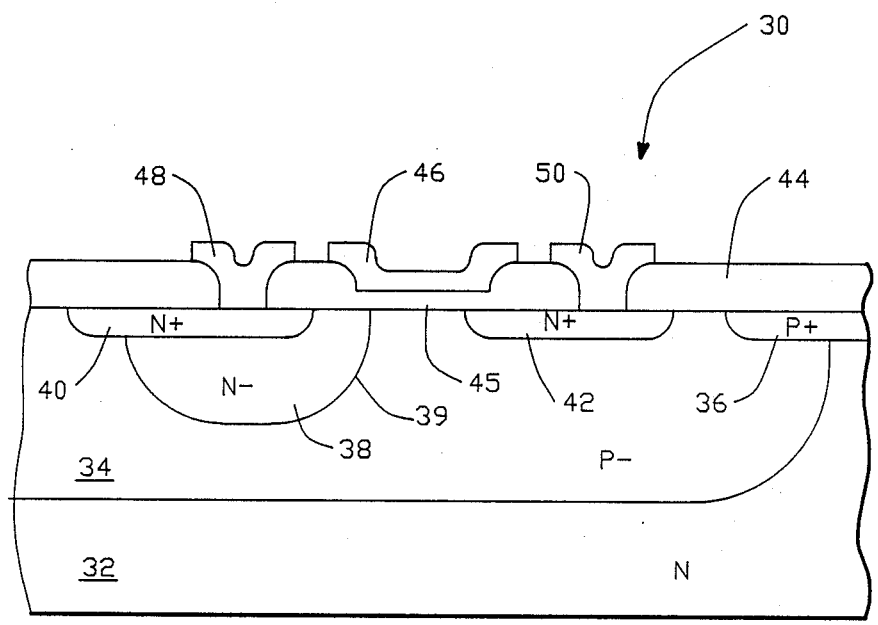
FIG. 2 is a cross-sectional view of a drain-well/extension high-voltage MOS transistor structure constructed in accordance with an alternate embodiment of the present invention.

Referring now to FIG. 2, an alternate embodiment of the present invention, generally indicated by the reference numeral 30, is shown. The structure 30 illustrates the versatility of the present invention in providing an N-channel MOS transistor structure fabricated in a N-type substrate 32. The provision of a N-channel transistor on an N-conductivity substrate 32 is a typical requirement in a fabrication of complimentary MOS (CMOS) devices.

As shown on FIG. 2, the high voltage MOS structure of the present invention is constructed in a P-well 34 formed by the provision of a boron impurity to a concentration of approximately $10^{16}/cm^3$. A P+ channel stop 36 is provided at the surface of the substrate 32 overlapping the junction of the P-well 34 as is typical of conventional CMOS devices. Within the P-well 34, a drain-well/extension region 38 is formed along with drain and source regions 40, 42 substantially in the same configuration relative to one another as in structure 10 of FIG. 1. The drain-well/extension region 38, however, is provided with an N− conductivity by the presence of a phosphorus impurity at a concentration of approximately $10^{16}/cm^3$. The drain and source regions 40, 42 are provided with an N+conductivity by the presence of a phosphorus impurity at a concentration of approximately $2 \times 10^{17}/cm^3$. The structure 30 is completed by the provision a dielectric layer 44, again preferably of silicon dioxide, having a thickness of 5,000 to 6,000 angstroms with the exception of a gate oxide layer 45. The gate oxide layer 45 preferably has a thickness of 500 to 600 angstroms and extends generally over the channel region defined by the drain-well/extension channel junction 39 and the edge of the source region 42 at its closest approach to the junction 39. Gate, drain and source contacts 46, 48, 50 are provided over the gate oxide layer 45 and to the drain and source regions 40, 42 respectively.

Figure 3:
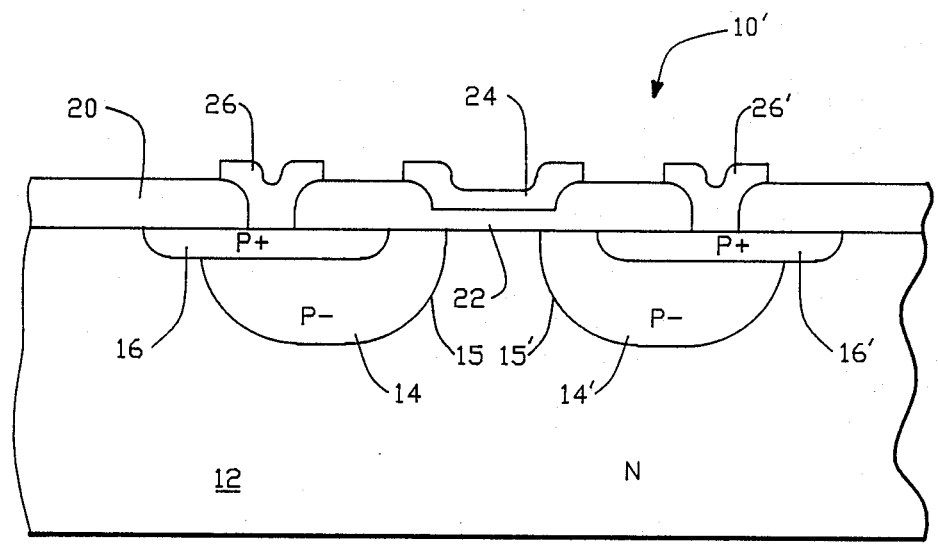
FIG. 3 is a cross-sectional view of a dual drain-well/extension high-voltage MOS transistor structure constructed in accordance with another alternate embodiment of the present invention for use as a bilateral analog switch.

Another alternate embodiment of the present invention is shown in FIG. 3. This embodiment, generally indicated by the reference numeral 10', is configured as a high-voltage, bilateral analog switch. As shown, the switch 10' is substantially similar to the structure 10 shown in FIG. 1. However, the source region 18 of the structure 10 is instead replaced by a second drain-well/extension region 14' and a second drain region 16' in bilateral symmetry with the drain-well/extension region 14 and drain region 16 in the switch 10'. Thus, the channel region is formed between the two drain-well channel junctions 15, 15'. The gate oxide layer 22 and gate contact 24 are provided over the surface of the substrate 12 so as to overlie the channel defined by the channel junctions 15, 15' and further slightly overlapping an edge portion of each of the drain-well/extension regions 14, 14'. Consequently, the switch 10' realizes a high-voltage operational capability independent of which drain contact 26, 26' is in fact used as the drain connection to the switch 10'and which is used as the source.

Figure 4:
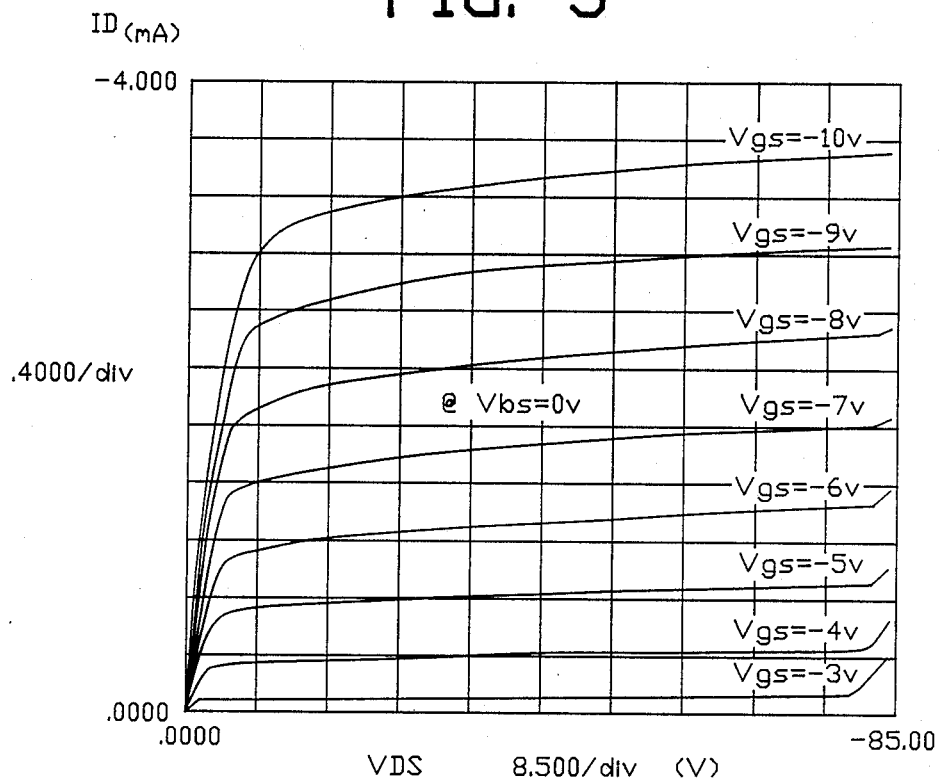
FIG. 4 depicts the current/voltage characteristic of a P-channel drain-well/extension high-voltage MOS transistor structure fabricated in accordance with the present invention.

FIG. 4 graphically describes the current to voltage characteristic of a P-channel drain-well/extension high-voltage MOS transistor structure constructed in accordance with an embodiment of the present invention substantially the same as shown in FIG. 1. The structure, as graphically shown, is capable of high voltage operation in excess of 80 volts; some 60 volts higher than that attainable by conventional MOS logic transistors. The current/voltage characteristic is quite linear for gate to source voltages of less than approximately −6 volts throughout almost the entire drain to source voltage operating range of the structure 10.

Referring to FIG. 5, the preferred method of fabricating high-voltage MOS transistor structures having a drain-well/extension region will now be described. The structure to be fabricated is a P-channel high-voltage MOS transistor adjacent an N-channel MOS transistor having a generally conventional MOS transistor structure. A substrate 12, provided with a background doping density of approximately $10^{15}/cm^3$ of a phosphorous impurity is preferably the initial process element. However, a substrate of semiconductor or insulative material covered by an epitaxial semiconductor layer, corresponding in conducting and doping density to the above-described substrate 12, could be equally used. Assuming the use of the simple semiconductor substrate 12, a dielectric oxide layer 52 is then grown uniformly across the surface of the substrate 12. This oxide layer 52 is a proto-field oxide layer having an initial thickness sufficient to act as an implantation barrier or mask in a subsequent processing step. Next, the proto-field oxide layer 52 in etched to open a window 54 in preparation for the subsequent formation of a N-channel MOS transistor well region. A second window 56 is simultaneously opened to allow the formation of a drain-well-/extension region. The substrate surface is then generally exposed to an ion implantation of P-type impurities 58, preferably of boron, at an energy of 80 KeV to a dosage of $10^{13}/cm^2$. Consequently, the impurities 58 are only implanted into the substrate within the window areas 54, 56. A drive-in diffusion step is then performed at 1200 degrees centigrade for a period of 10 hours to realize a final impurity concentration of approximately $10^{16}/cm^3$.

As shown in FIG. 6, a P- conductivity well region 60 is formed as a consequence of the drive-in diffusion step. Additionally, a deep drain-well/extension region 62 is simultaneously formed. Both regions 60, 62 are of an approximately equal doping concentration and extend to a common junction depth of between 6 and 8 micrometers beneath the surface of the substrate 12. The radius of curvature at the lateral extents of the region 62 approaches that of the junction depth as a result of the drive-in diffusion of the implanted impurities.

An additional thickness of silicon dioxide is then grown across the surface of the substrate 12 and the existing proto-field oxide 52 to yield a new proto-field oxide layer generally indicated by the reference numeral 64. The thickness of the additional oxide grown is again preferably sufficient to act as a masking layer for a subsequent ion implantation step. The proto-field oxide layer 64 is then etched to open channel stop windows 66, 68 at the surface boundaries of the P-well 60 and to open P-channel transistor drain and source windows 70, 72. The drain window 70 is opened at least partially over the drain-well/extension region 62 so that the drain region ultimately formed is positioned partially within the drain-well/extension region 62 through spaced apart form what will become the channel of the P-channel transistor structure. The source window 72 is placed so that the ultimately formed source region will be space apart from the drain-well/extension region by a portion of the substrate 12 thereby fully defining the channel region of the P-channel transistor.

A diffusion step is then performed to initially deposit P-type impurities 74 in preparation for forming the N-channel transistor channel stops under the windows 66, 68 and the source and drain regions of the P-channel transistor structure. This diffusion is preferably performed utilizing a boron deposition impurity over the substrate surface for ½ hour at a temperature of 1050 degrees centigrade. A short drive-in diffusion step is then performed at a temperature of 1000 degrees centigrade for a period of 90 minutes to quickly drive-in and anneal the impurities. The annealed impurities form P+ conductivity channel stops 76, 78 guarding the P-well region 60 and the P+ drain and source regions 80, 82 of the P-channel transistor structure, as shown on FIG. 7. The channel stops 76, 78 and drain and source regions 80, 82 thus share a common final doping density of approximately $2 \times 10^{19}/cm^3$ and junction depth of between 1.5 and 2 micrometers.

Figure 7:
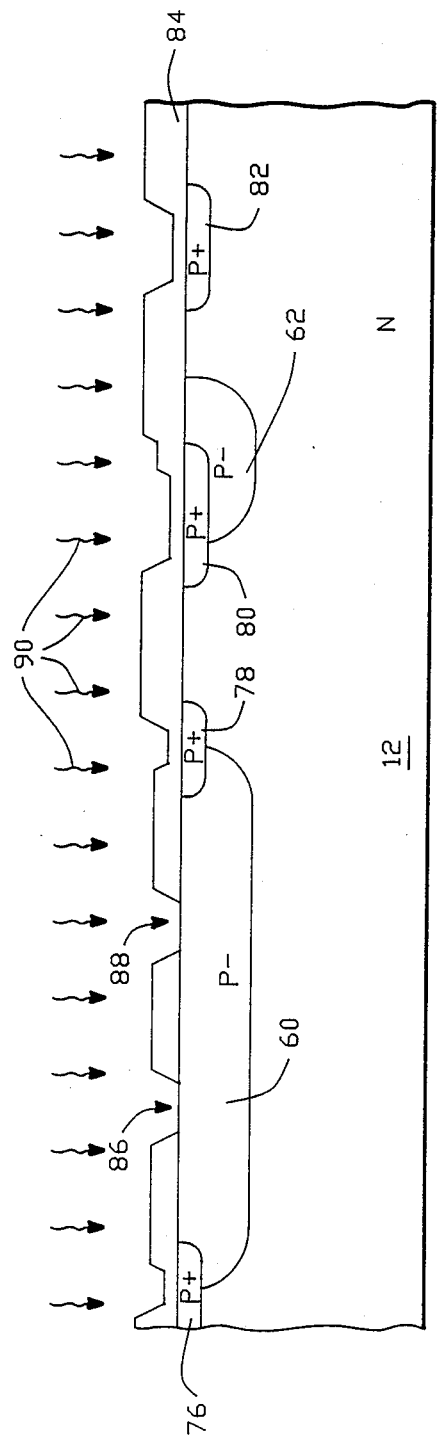
Figure 8:
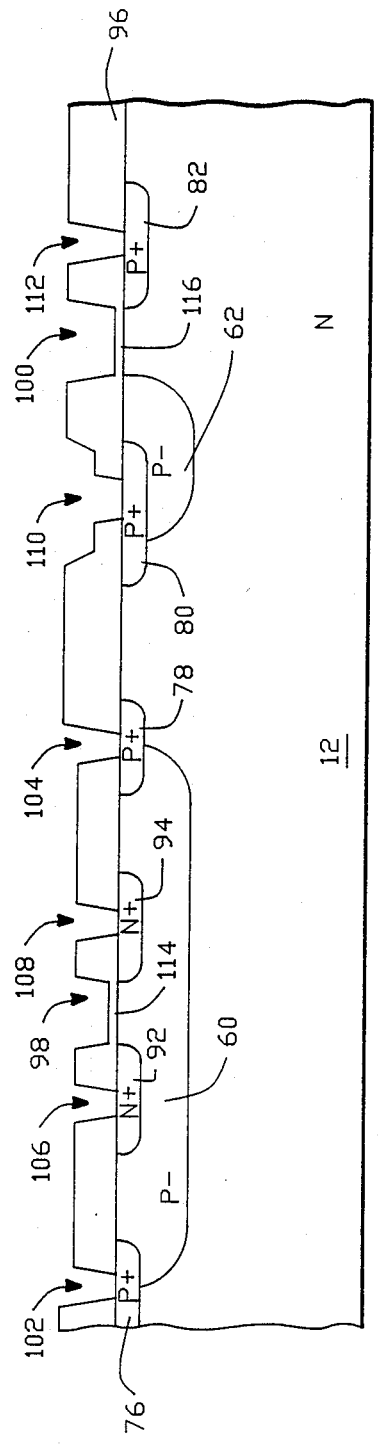

Another thickness of oxide is then provided over the surface of the substrate 12 to yield a proto-field oxide layer generally indicated by the reference numeral 84 in FIG. 7. Source and drain windows 86, 88 are then etched through the oxide layer 84 over the P-well region 60 in preparation for the formation of N-type source and drain regions for the N-channel transistor. A diffusion step providing N-type impurities 90 is then performed utilizing, preferably, a phosphorous impurity deposited for 30 minutes at 900 degrees centigrade. The N-type impurities are then diffused at a temperature of 1000 degrees centigrade for a period of approximately 60 minutes to realize a final impurity concentration of about $1 \times 10^{20}/cm^3$. Thus, N+ conductivity drain and source regions 92, 94 are formed within the P-well region 60, substantially as shown in FIG. 8.

Next, another layer of oxide is grown over the surface of the substrate 12 to form a thicker proto-field oxide layer 96. Gate contact windows 98, 100 are then etched entirely through the proto-field oxide layer 96 to the surface of the substrate 12. Channel stop 102, 104, N-Channel drain and source 106, 108 and P-Channel drain and source windows are also simultaneously opened. Of particular significance is that the gate contact windows 98, 100 extend between the closest approaching edges of the N-Channel drain and source regions 92, 94 and the P-channel, drain-well/extension region 62 and the source region 82, respectively, at the surface of the substrate 12. Next, a thin gate oxide layer of approximately 500 to 600 angstroms is then grown back at the exposed surfaces of the substrate 12. A final etching of the now complete field oxide layer 96 is then performed to re-open the channel stop contact windows 102, 104, N-channel transistor drain and source contact windows 106, 108 and the drain and source contact windows 110, 112 of the high-voltage P-channel transistor structure.

Referring now to FIG. 9, a metalization step is then performed to provide aluminum conductors 118, 120 in electrical contact with the channel stops 76, 78. Alternately, polysilicon or metal silicide maybe used to form the conductors. Drain and source contacts 126, 128 are provided in electrical contact with the drain and source regions 92, 94 of the N-channel transistor while drain and source contacts 130, 132 are provided in electrical contact with the drain and source regions 80, 82 of the high-voltage MOS transistor structure. Finally, gate contacts 122, 124 are provided over the gate oxide layers 114, 116 to complete the respective N-channel and high-voltage P-channel transistors. Thus, the N-channel transistor as shown in FIG. 8 is generally optimized for use as part of a logic circuit while the P-channel transistor is optimally configured for high-voltage operation. Both transistors are formed closely adjacent on the surface of the substrate 12, in accordance with the present invention.

Referring now to FIG. 10, a pair of complimentary high-voltage transistors, generally indicated by the reference numeral 132, is shown. The structure 132 can be advantageously fabricated utilizing substantially the same process described above as used to yield the structure shown in FIG. 9. To achieve this, only a minor modification of the process is needed. The process is performed as described above through completion of the anealing of the N+ impurities to form the drain and source regions 92, 94. The drain region 92, however, is formed offset from the channel. Next, another masking layer of proto-field oxide is grown, again as before. An additional processing step is then performed to first open a window through the proto-field oxide layer over the gap between the drain region 92 and the channel. N-type impurities are then lightly implanted at the corresponding portion of the surface of the P-well region 60. These N-type impurities, preferably phosphorous provided at an energy of about 100 KeV and to a dosage of $10^{14}/cm^2$, are then annealed at a temperature of 1000 degrees centigrade for a period of about 30 minutes to form an N— conductivity lightly-doped region 134, as shown in FIG. 10, extending to a junction depth of about 1 to 2 micrometers within the P-well 60. Another thickness of proto-field oxide is then grown to close the lightly-doped region window. The remainder of the processing steps described above leading to the structure of FIG. 9 are then performed to complete the formation of the N- and P- channel transistors, as shown in FIG. 10. The provision of the lightly-doped region 134 acts to reduce the electric field intensity at the drain region junction near the surface of the substrate and thereby extends the reverse breakdown voltage limit of the transistor. Thus, both the P-channel and N-channel MOS transistors of the structure 132 can operate at high-voltages.

The process of the present invention can also be modified to yield complementary transistors having the structures of the devices shown in FIGS. 1 and 2. To achieve this, only two modifications of the process leading to the structure shown in FIG. 9 are needed. In performing the process, the P-well and drain-well/extension regions 60, 62 are formed as before. Next, another masking layer of proto-field oxide is grown, again as before. An additional processing step is then performed to first open a window through the proto-field oxide layer and then implant N-type impurities at the corresponding portion of the surface of the P-well region 60. These N-type impurities, preferably phosphorous provided at an energy of 100 KeV and to a dosage of $10^{14}/cm^2$, are then driven in at a temperature of 1100 for a period of about 90 minutes to form an N- conductivity drain-well/extension region 134' (shown in dashed line in FIG. a) within the P-well 60. Another thickness of proto-field oxide is then grown to close drain-well/extension window. The remainder of the processing steps described above leading to the structure of FIG. 9 are then performed to complete the formation of the N- and P- channel transistors. The only further difference is that the drain region 92 is again formed offset so that the edge of the channel region is defined by the drain-well/extension region 134' rather than the drain region 92. Thus, both the P-channel and N-channel MOS transistors of the structure 132 possess the drain-well/extension region high-voltage structure of the present invention.

Accordingly, a high-voltage MOS transistor structure having a drain-well/extension region formed between the drain region and channel of the transistor and extending beneath the drain region, along a large radius of curvature relative to the corresponding portion of the drain junction has been described. A preferred manner of fabricating the high-voltage MOS transistor structure of the present invention has also been disclosed wherein the structure is fabricated in a process of minimum complexity simultaneous with the fabrication of MOS transistors including those of a complimentary channel type suitable for implementing high-speed logic circuits Naturally, many modifications and variations of the present invention are possible in light of the above description of the preferred embodiments and teachings. These modifications may include changes in the specific conductivity type of the substrate and the regions formed therein, and, the specific impurities, the impurity concentrations, and processing times and temperatures employed. Further, the specific details of conventional and well-known oxide growth, photo-lithographic and metalization steps have not been described in order to not obscure the present invention. It is, therefore, to be understood that, within the scope of the appended claims, the present invention may be practiced otherwise than as specifically described.

I claim:

1. A method of simultaneously fabricating a high-voltage transistor and a complementary conductivity high-speed transistor at the surface of a substrate, said method comprising the steps of:
    (a) providing a semiconductor layer having a first predetermined conductivity type at the surface of said substrate;
    (b) simultaneously forming first and second well regions in said semiconductor layer and adjacent a surface thereof, said first and second well regions being of a second predetermined conductivity type; and
    (c) forming first and second pairs of source and drain regions at the surface of said semiconductor layer, said first pair of source and drain regions being of said first predetermined conductivity typed and formed in said first well region so as to define a high-speed transistor channel region in said well region, said second pair of source and drain regions being of said second predetermined conductivity type, the source region of said second pair being formed spaced apart from said second well region at the surface of said semiconductor layer so as to define a high-voltage transistor channel region in said semiconductor layer, at least a portion of the drain region of said second pair being formed within said second well region such that the drain region of said second pair is encapsulated within a drain extension portion of said second well region with respect to the full depth and width of said high-voltage channel region.

2. The method of claim 1 wherein said step of forming said second pair of source and drain regions provides for the formation of said source region of said second pair at a distance of 2 to 30 micrometers from said second well region.

3. The method of claim 1 or 2 wherein the step of simultaneously forming first and second well regions provides for the formation of said first and second well regions with a junction depth of between 1 and 6 micrometers.

4. The method of claim 3 wherein said first and second well regions are formed to have a sidewall radius of curvature substantially the same as the junction depth of said first and second well regions.

5. The method of claim 4 further comprising the steps of:
    (a) forming respective gate oxide layers overlying said high-speed channel region and said high-voltage channel region; and
    (b) forming respective gate electrodes overlying said high-speed channel region and said high-voltage channel region.

6. A method of simultaneously fabricating high-speed, low-voltage MOS transistors and lower-speed, high-voltage transistors on a common monolithic substrate, said method comprising the steps of:
- (a) providing a semiconductor layer of a first conductivity type;
- (b) simultaneously forming first and second well regions of a second conductivity type at the surface of said semiconductor layer, said first and second well regions having a common impurity density and a junction depth of between approximately 1 and 6 micrometers;
- (c) forming first and second pairs of source and drain regions at the surface of said semiconductor layer, said first pair of source and drain regions being of said first conductivity type and having an impurity density greater than that of said first and second well regions, said pair of source and drain regions being formed within said first wall region spaced apart from one another by a first channel length corresponding to a high-speed, low-voltage transistor, said second pair of source and drain regions being of said second conductivity type and having an impurity density greater than that of said first and second well region, the source and drain of said second pair being formed spaced apart from one another by a second channel length and an intervening drain-well/extension portion of said second well region substantially encompassing the drain region of said second pair, said second channel length being between 2 and 15 micrometers and corresponding to a lower-speed, high-voltage transistor.

7. The method of claim 6 wherein said step of simultaneously forming first and second well regions includes further simultaneously forming a third well region having an impurity density and junction depth in common with those of said first and second well regions and wherein said source region of said second pair is substantially encompassed within said third well region such that a drain-well/extension region portion of said third well region and the drain-well/extension portion of said second well region define the active channel boundaries of the lower-speed, high-voltage transistor.

* * * * *